United States Patent
Hackman et al.

(10) Patent No.: US 9,203,193 B2
(45) Date of Patent: Dec. 1, 2015

(54) ELECTRICAL DEVICE HAVING A CIRCUIT BOARD AND A DIFFERENTIAL PAIR OF SIGNAL CONDUCTORS TERMINATED THERETO

(71) Applicant: Tyco Electronics Corporation, Berwyn, PA (US)

(72) Inventors: John Allen Hackman, Elizabethtown, PA (US); Troy Lyndon Blazek, Cottage Grove, MN (US)

(73) Assignee: Tyco Electronics Corporation, Berwyn, PA (US)

( * ) Notice: Subject to any disclaimer, the term of this patent is extended or adjusted under 35 U.S.C. 154(b) by 23 days.

(21) Appl. No.: 14/147,350

(22) Filed: Jan. 3, 2014

(65) Prior Publication Data

US 2015/0111402 A1    Apr. 23, 2015

Related U.S. Application Data

(60) Provisional application No. 61/892,205, filed on Oct. 17, 2013.

(51) Int. Cl.
*H01R 13/648*   (2006.01)
*H01R 9/03*     (2006.01)
*H01R 12/59*    (2011.01)
(Continued)

(52) U.S. Cl.
CPC .............. *H01R 13/648* (2013.01); *H01R 9/034* (2013.01); *H01R 9/035* (2013.01); *H01R 12/596* (2013.01); *H01R 12/62* (2013.01); *H01R 4/646* (2013.01); *H01R 12/57* (2013.01); *H01R 13/658* (2013.01); *H01R 13/6658* (2013.01); *H01R 23/662* (2013.01); *H01R 2103/00* (2013.01); *H05K 1/117* (2013.01)

(58) Field of Classification Search
CPC .... H01R 13/658; H01R 4/646; H01R 23/662; H01R 2103/00
USPC ................ 439/98, 497, 579, 607.49, 607.41, 439/607.51
See application file for complete search history.

(56) References Cited

U.S. PATENT DOCUMENTS 7,435,132 B1   10/2008  Fong et al.
7,498,523 B2   3/2009   Miller
(Continued)

FOREIGN PATENT DOCUMENTS

EP      2 224 552 A2    9/2010
EP      2224552 A2 *    9/2010

OTHER PUBLICATIONS

International Search Report, International Application No. PCT/US2014/059844, Internatinal Filing Date, Oct. 9, 2014.

*Primary Examiner* — Abdullah Riyami
*Assistant Examiner* — Justin Kratt

(57) ABSTRACT

Electrical device including a circuit board having signal contacts and at least one ground contact along a surface of the circuit board. The electrical device also includes a communication cable having a differential pair of signal conductors, a shield layer that surrounds the signal conductors, and a cable jacket that surrounds the shield layer. Each of the signal conductors has a wire-terminating end that is engaged to a corresponding signal contact of the circuit board. The cable jacket has an access opening therethrough that exposes a portion of the shield layer. The electrical device also includes a ground-terminating component that is electrically coupled to the shield layer through the access opening and electrically coupled to the at least one ground contact.

20 Claims, 9 Drawing Sheets

(51) Int. Cl.
*H01R 12/62* (2011.01)
*H01R 12/70* (2011.01)
*H01R 13/658* (2011.01)
*H01R 103/00* (2006.01)
*H01R 4/64* (2006.01)
*H01R 12/57* (2011.01)
*H01R 13/66* (2006.01)
*H05K 1/11* (2006.01)

(56) References Cited

U.S. PATENT DOCUMENTS

| | | |
|---|---|---|
| 8,011,950 B2 | 9/2011 | McGrath et al. |
| 2010/0210142 A1* | 8/2010 | McGrath et al. ......... 439/620.22 |
| 2011/0306244 A1 | 12/2011 | Zhang et al. |
| 2012/0052699 A1 | 3/2012 | MacDougall |
| 2013/0072041 A1* | 3/2013 | Nonen et al. .................... 439/98 |

* cited by examiner

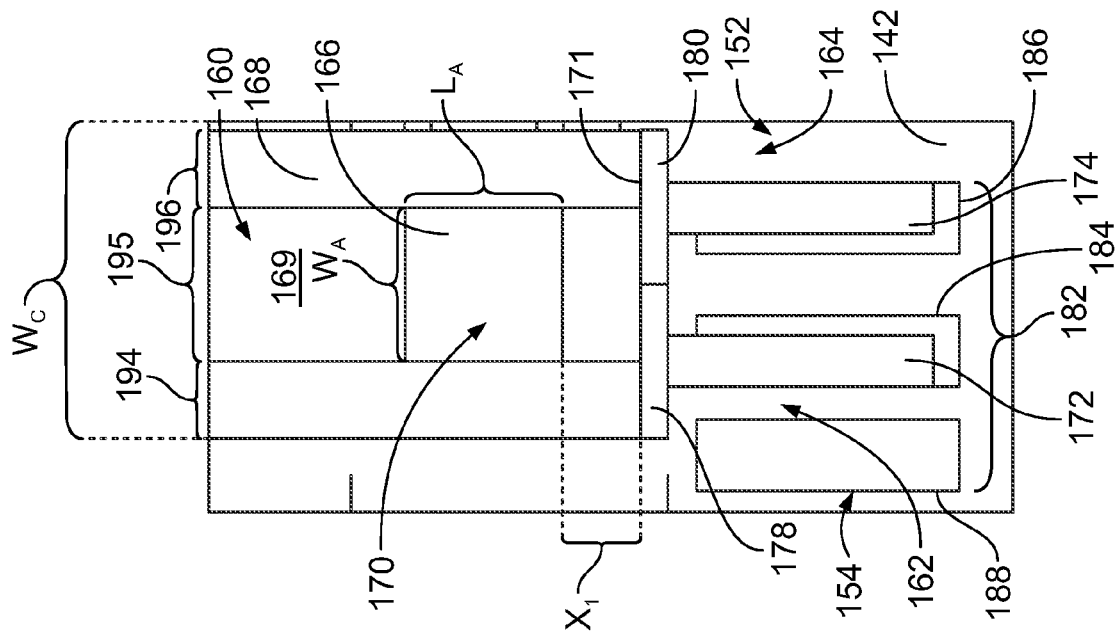
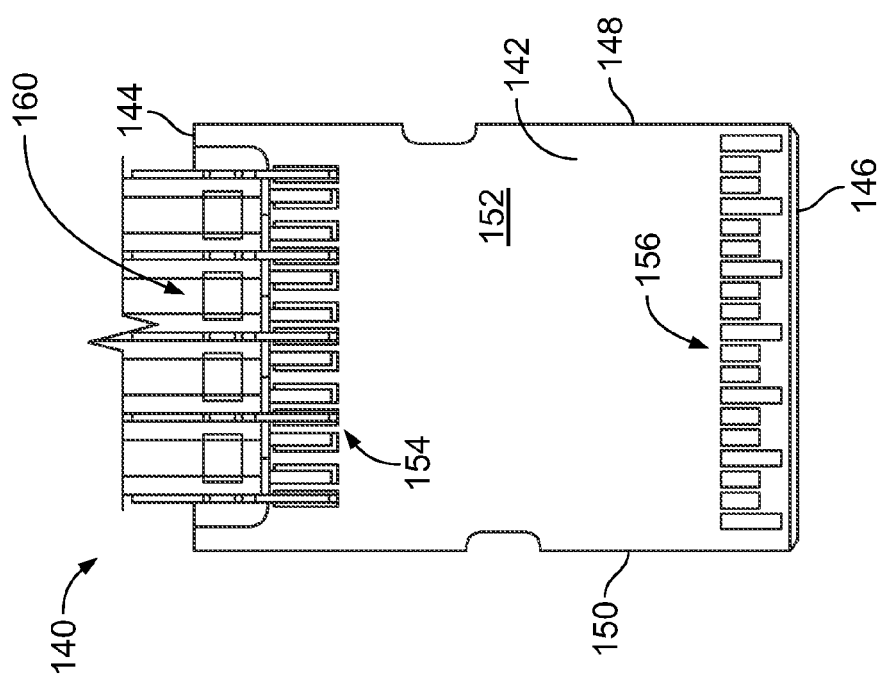
FIG. 3
FIG. 2

ELECTRICAL DEVICE HAVING A CIRCUIT BOARD AND A DIFFERENTIAL PAIR OF SIGNAL CONDUCTORS TERMINATED THERETO

CROSS-REFERENCE TO RELATED APPLICATION

The present application claims the benefit of U.S. Provisional Patent Application No. 61/892,205, filed on Oct. 17, 2013, which is incorporated herein by reference in its entirety.

BACKGROUND OF THE INVENTION

The subject matter herein relates generally to an electrical device having a circuit board and one or more differential pairs of signal conductors with exposed wire-terminating ends that are terminated to the circuit board.

Various types of electrical devices may include circuit boards that are electrically coupled to differential pairs of signal conductors or, more specifically, pairs of signal conductors that transmit differential signals. For example, at least some known communication cables include a differential pair of signal conductors and a drain wire (also referred to as a grounding wire) that extends alongside the signal conductors for the length of the communication cable. The signal conductor(s) and the drain wire may be surrounded by a shield layer that, in turn, is surrounded by a cable jacket. The shield layer includes a conductive foil that, along with the drain wire, functions to shield the signal conductor(s) from electromagnetic interference (EMI) and generally improve performance. At an end of the communication cable, the cable jacket, the shield layer, and insulation that covers the signal conductor(s) may be removed (e.g., stripped) to expose the signal conductor(s). The drain wire and the exposed portions of the conductor(s) may then be mechanically and electrically coupled (e.g., soldered) to corresponding elements of an electrical device.

However, the above communication cable may have some undesirable characteristics, particularly when the communication cable is used for high speed applications (e.g., greater than 10 Gbps). For example, when attempting to terminate the drain wire to the circuit board, the conductive foil of the shield layer at the end of the communication cable may be unevenly cut or torn thereby allowing electromagnetic radiation to leak from the end of the cable. The conductive foil may also cause an unwanted increase in impedance at the end of the cable. Furthermore, the conductive foil is typically thin and may require careful handling during manufacture and termination of the communication cable. Thus, terminating the drain wire may risk damaging the conductive foil and may increase the overall cost of cable manufacturing.

Accordingly, there is a need for a communication cable that can be electrically coupled to an electrical component without terminating a drain wire to the electrical component.

BRIEF DESCRIPTION OF THE INVENTION

In one embodiment, an electrical device is provided that includes a circuit board having signal contacts and at least one ground contact along a surface of the circuit board. The electrical device also includes a communication cable having a differential pair of signal conductors, a shield layer that surrounds the signal conductors, and a cable jacket that surrounds the shield layer. Each of the signal conductors has a wire-terminating end that is engaged to a corresponding signal contact of the circuit board. The cable jacket has an access opening therethrough that exposes a portion of the shield layer. The electrical device also includes a ground-terminating component that is electrically coupled to the shield layer through the access opening and electrically coupled to the at least one ground contact.

In another embodiment, an electrical device is provided that includes a circuit board having signal contacts and at least one ground contact along a surface of the circuit board. The electrical device includes a communication cable having a differential pair of signal conductors, a shield layer that surrounds the signal conductors, and a cable jacket that surrounds the shield layer. Each of the signal conductors has a wire-terminating end that is engaged to a corresponding signal contact of the circuit board. The cable jacket has an access opening therethrough that exposes a portion of the shield layer. The electrical device also includes a ground-terminating component including a main panel and a finger that projects from the main panel. The finger engages the at least one ground contact. The main panel interfaces with the cable jacket and is electrically coupled to the shield layer through the access opening.

In yet another embodiment, an electrical device is provided that includes a circuit board having signal contacts and ground contacts along a surface of the circuit board. The electrical device also includes a plurality of communication cables that each has a differential pair of signal conductors, a shield layer that surrounds the signal conductors of the respective communication cable, and a cable jacket that surrounds the shield layer of the respective communication cable. Each of the signal conductors has a wire-terminating end that is engaged to a corresponding signal contact of the circuit board. Each of the cable jackets having an access opening therethrough that exposes a portion of the corresponding shield layer. The electrical device also includes a ground-terminating ferrule having a main panel and fingers that project from the main panel. The fingers engage corresponding ground contacts of the circuit board. The main panel interfaces with the cable jackets and is electrically coupled to the shield layers through the corresponding access openings.

BRIEF DESCRIPTION OF THE DRAWINGS

FIG. 2 is a plan view of an electrical assembly according to one embodiment that may be used with the electrical device of FIG. 1.

FIG. 3 is an enlarged portion of the plan view of FIG. 1 illustrating features of the electrical assembly in greater detail.

DETAILED DESCRIPTION OF THE INVENTION

Embodiments described herein include electrical devices (e.g., electrical connectors, circuit board assemblies, and the like) that have a circuit board and differential pairs of signal conductors terminated to the circuit board. The differential pairs of signal conductors may be part of a communication cable (or cables) that also includes a shield layer surrounding the signal conductors and a cable jacket surrounding the shield layer. In particular embodiments, the communication cable does not include a drain (or ground) wire. The cable jacket may have an access opening that exposes a portion of the shield layer so that the shield layer is accessible. For example, embodiments may include a ground-terminating component that is located proximate to the access opening and is electrically coupled to the shield layer through the access opening. Optionally, a solder material (e.g., metal alloy material) may be deposited within the access opening and melted to mechanically and electrically couple the shield layer and the ground-terminating component. Other conductive binding materials (e.g., epoxies, foams, tapes, and the like) may be used to facilitate electrically coupling the shield layer and the ground-terminating component. The ground-terminating component may have a variety of configurations as set forth herein.

Figure 1:
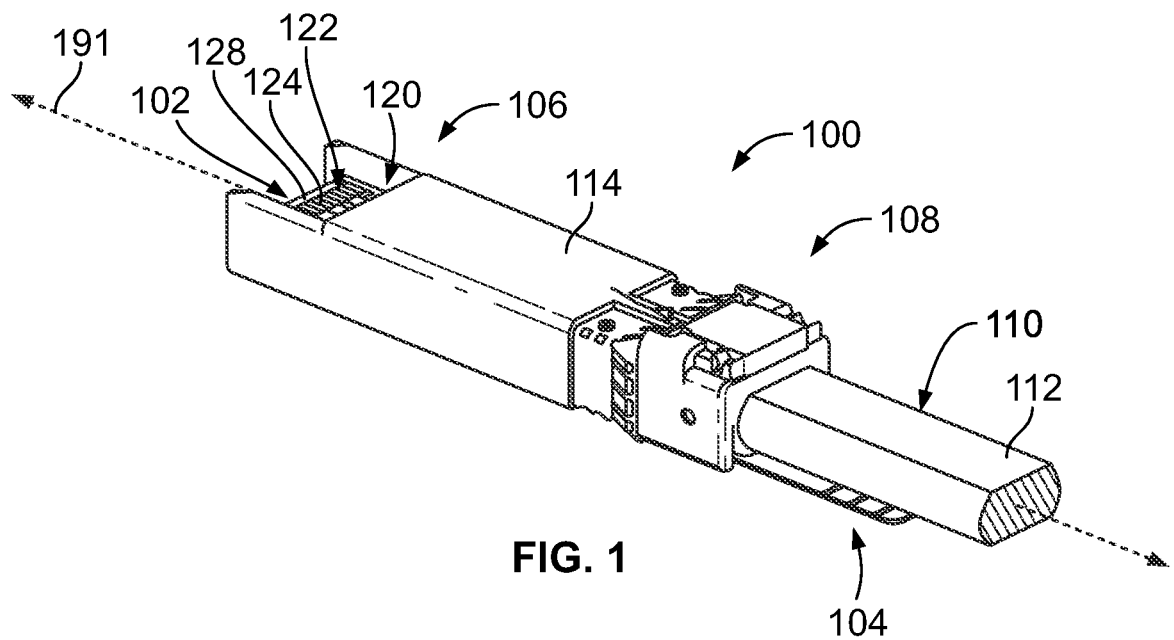
FIG. 1 is a perspective view of an electrical device formed in accordance with an embodiment.

FIG. 1 is a perspective view of an electrical device 100 formed in accordance with one embodiment that includes a circuit board 122 and a communication cable 110 having one or more differential pairs of signal conductors (not shown). In the illustrated embodiment, the electrical device 100 is an electrical connector, such as a small form-factor pluggable (SFP) transceiver. However, the electrical device 100 may be other types of electrical connectors in other embodiments. In alternative embodiments, the electrical device 100 may be any device that includes a circuit board having differential pairs of signal conductors terminated thereto.

As shown in FIG. 1, the electrical device 100 has a mating end 102, a loading end 104, and a central axis 191 extending therebetween. The electrical device 100 includes a device housing 114 that has a housing cavity (not shown) configured to hold a portion of a connector assembly 120. The electrical device 100 may include a plug portion 106 at the mating end 102 and a cable portion 108 at the loading end 104. The plug portion 106 is configured to be inserted into a receptacle (not shown) of a communication system (not shown). The cable portion 108 is configured to couple to the communication cable 110 which has an insulative jacket 112. The insulative jacket 112 may surround the one or more differential pairs of signal conductors. The insulative jacket 112 may comprise a number of layers that surround the differential pairs for shielding the differential pairs and providing strain resistance for the communication cables. The layers may include, for example, polyvinyl chloride (PVC), copper braid, aluminized Mylar®, and tape.

The connector assembly 120 includes the circuit board 122, which has electrical contacts 124 located at a mating edge 128 of the circuit board 122, which is proximate to the mating end 102 of the electrical device 100. In an exemplary embodiment, the mating edge 128 is configured to mate with an electrical connector (not shown) of the receptacle and establish a communicative connection through the electrical contacts 124. The electrical contacts 124 may be communicatively coupled to the differential pairs of the signal conductors.

FIG. 2 is a plan view of a portion of an electrical assembly 140 formed in accordance with an embodiment that may be used with the electrical device 100 of FIG. 1. For example, the electrical assembly 140 may be used as the connector assembly 120 (FIG. 1) and may be disposed at least partially within the device housing 114 (FIG. 1). The electrical assembly 140 includes a circuit board 142 having a terminating edge 144, a mating edge 146, and side edges 148, 150 that extend from the terminating edge 144 toward the mating edge 146. Although not shown, the circuit board 142 may include a number of dielectric layers (e.g., FR-4 layers), traces, vias, and ground planes.

The circuit board 142 includes opposite board surfaces, although only one board surface 152 is shown in FIG. 2. As shown, the board surface 152 includes electrical contacts 154 that are proximate to the terminating edge 144 and electrical contacts 156 that are proximate to the mating edge 146. In the illustrated embodiment, the electrical contacts 154, 156 are contact pads and may include signal and ground contacts. The electrical contacts 154, 156 may be communicatively coupled to one another through the circuit board 142. For example, the traces (not shown) of the circuit board 142 may communicatively couple the electrical contacts 154, 156.

The electrical assembly 140 also includes a plurality of communication cables 160 that are electrically coupled to the circuit board 142 along the board surface 152. Four communication cables 160 are shown in FIG. 2, but the electrical assembly 140 may include more or fewer communication cables 160. For example, an additional four communication cables 160 may be electrically coupled to the circuit board 142 along the board surface (not shown) that is opposite the board surface 152.

In some embodiments, the communication cables 160 may be characterized as parallel-pair cables that do not include a drain wire. In parallel-pair configurations, the communication cables 160 include differential pairs of signal conductors in which the two signal conductors of a single differential pair extend parallel to each other through a length of the communication cable 160. Although not shown, the communication cables 160 of FIG. 2 may be part of a larger cable and may be surrounded by an external jacket or sleeve. The external jacket may be stripped to permit manipulation of the communication cables 160 as set forth herein. In alternative embodiments, the communication cables 160 may include a drain wire and/or the signal conductors within the communication cable 160 may form a twisted pair of signal conductors.

FIG. 3 is an enlarged view of one of the communication cables 160 coupled to the circuit board 142 along the board surface 152. Each of the communication cables 160 may include a differential pair of signal conductors 162, 164, a shield layer 166 that surrounds the signal conductors 162, 164, and a cable jacket 168 that surrounds the shield layer 166. By way of example only, the cable jacket 168 may be formed from a polyester-like material, such as biaxially-oriented polyethylene terephthalate (BoPET), which is also known as Mylar®. For parallel-pair configurations, the communication cable 160 has opposite contoured sides 194, 196 and opposite planar sides 195 that extend between and join the contoured sides 194, 196. Only one planar side 195 is shown in FIG. 3, but it is understood that the communication cable 160 has another planar side 195 that is opposite the planar side 195 shown in FIG. 3. The contoured sides 194, 196 may have cross-sections taken transverse to a length of the communication cable that have a semi-circle shape. The communication cable has a width $W_C$.

The shield layer 166 may include, for example, a conductive foil (e.g., copper). As shown, the shield layer 166 is exposed through an access opening 170 of the cable jacket 168. The access opening 170 may be spaced from an end of the cable jacket 168. For example, the cable jacket 168 includes a jacket edge 171. The access opening 170 may be located a longitudinal distance $X_1$ away from the jacket edge 171 along a length of the communication cable 160.

The access opening 170 extends a depth into the communication cable 160 from an exterior surface 169 of the cable jacket 168 to the shield layer 166. The access opening 170 may be formed by, for example, using a laser (e.g., $CO_2$ laser) to etch the cable jacket 168 to remove the material of the cable jacket 168 and expose the shield layer 166. Accordingly, the access opening 170 may be a void along the shield layer 166. The access opening 170 may be partially defined by the material of the cable jacket 168 and the shield layer 166 (e.g., conductive foil). The access opening 170 may open to an exterior of the communication cable 160.

The access opening 170 may have a width $W_A$ and a length $L_A$. In the illustrated embodiment, the width $W_A$ is less than the width $W_C$ of the communication cable $W_C$. The width $W_A$ may be sized such that the access opening 170 extends only along the planar side 195 and does not extend into the contoured sides 194, 196. However, the width $W_A$ may be larger in other embodiments such that portions of the contoured sides 194, 196 also have material from the cable jacket 168 removed. For example, the width $W_A$ may be substantially equal to the width $W_C$.

In an exemplary embodiment, the signal conductors 162, 164 are insulated conductors having insulation layers 178, 180, respectively, that surround corresponding wire conductors 172, 174. As shown in FIG. 3, the wire conductors 172, 174 have had the insulation layers 178, 180 stripped therefrom to expose the wire conductors 172, 174. The exposed portions of the wire conductors 172, 174 are configured to be terminated to the circuit board 140. As such, the exposed portions of the wire conductors 172, 174 are hereinafter referred to as a wire-terminating ends 172, 174.

The communication cable 160 is configured to electrically couple to the circuit board 142 at multiple points. To this end, the circuit board 142 includes a contact set 182 that has three of the electrical contacts 154. More specifically, the contact set 182 includes a pair of signal contacts 184, 186 and a ground contact 188 that is located proximate to the pair of signal contacts 184, 186. In some cases, another ground contact may be positioned on an opposite side of the pair of signal contacts 184, 186. The circuit board 142 may have multiple contact sets 182 in which each contact set 182 electrically couples to a single communication cable 160. The signal contacts 184, 186 are configured to be electrically coupled to the wire-terminating ends 172, 174, respectively. For example, the wire-terminating ends 172, 174 may be soldered to the signal contacts 184, 186, respectively.

As set forth in greater detail below, embodiments may include ground-terminating components that are configured to ground the communication cables to the circuit board. The ground-terminating components may extend between the access opening 170 and the ground contact 188. The ground-terminating components may be mechanically and electrically coupled to the shield layer 166 through the access opening 170 and mechanically and electrically coupled to the ground contact 188. The mechanical and electrical coupling may be accomplished through soldering and/or using a conductive epoxy or foam. As such, the communication cable 160 may be grounded to the circuit board 142 by establishing a conductive path between the shield layer 166 and the ground contact 188. The ground contact 188, in turn, may be electrically coupled to one or more ground planes (not shown) of the circuit board 142.

Figure 4:
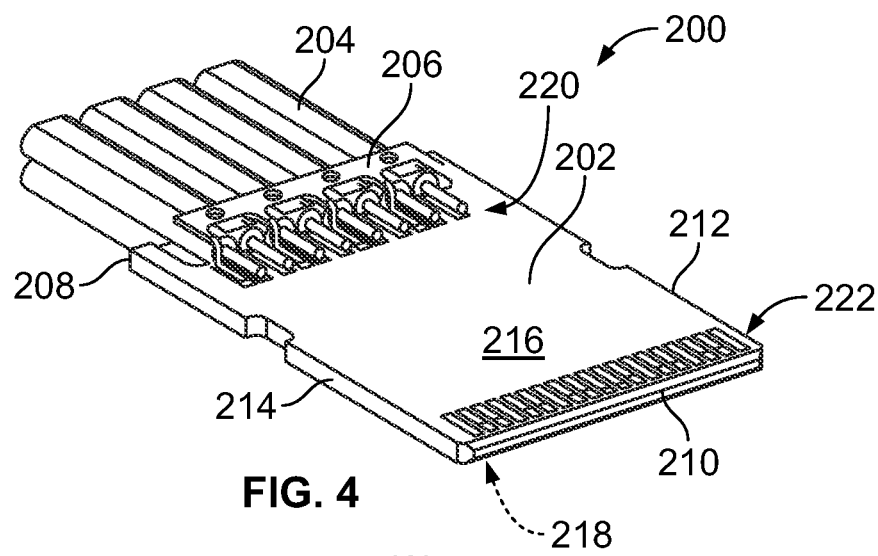
FIG. 4 is an isolated perspective view of an electrical assembly according to one embodiment that may be used with the electrical device of FIG. 1.

FIG. 4 is an isolated perspective view of an electrical assembly 200 that includes a circuit board 202, communication cables 204, and a ground-terminating component 206 that electrically couples the circuit board 202 and the communication cables 204. The ground-terminating component 206 may be referred to as a ground-terminating ferrule in some embodiments. The ground-terminating component 206 may be a single continuous piece of material. For example, the ground-terminating component 206 may be stamped and formed from sheet metal or may be molded or cast using a conductive material.

The circuit board 202 and the communication cables 204 may be similar or identical to the circuit board 142 (FIG. 2) and the communication cables 160 (FIG. 2). For example, the circuit board 202 has a terminating edge 208, a mating edge 210, and side edges 212, 214 that extend between the terminating and mating edges 208, 210. The circuit board 202 has first and second board surfaces 216, 218 in which each of the board surfaces 216, 218 may have electrical contacts (e.g., contact pads) exposed along the corresponding board surface. For example, the board surface 216 has electrical contacts 220 disposed proximate to the terminating edge 208 and electrical contacts 222 disposed proximate to the mating edge 210.

Although not shown, the electrical assembly 200 may be disposed within a housing to form an electrical device. In particular embodiments, the electrical assembly 200 may constitute a connector assembly that is disposed within a cavity of a device housing, such as the device housing 114 (FIG. 1). In such embodiments, the mating edge 210 may engage a mating connector (not shown) such that the electrical contacts 222 engage corresponding contacts of the mating connector.

Figure 5:
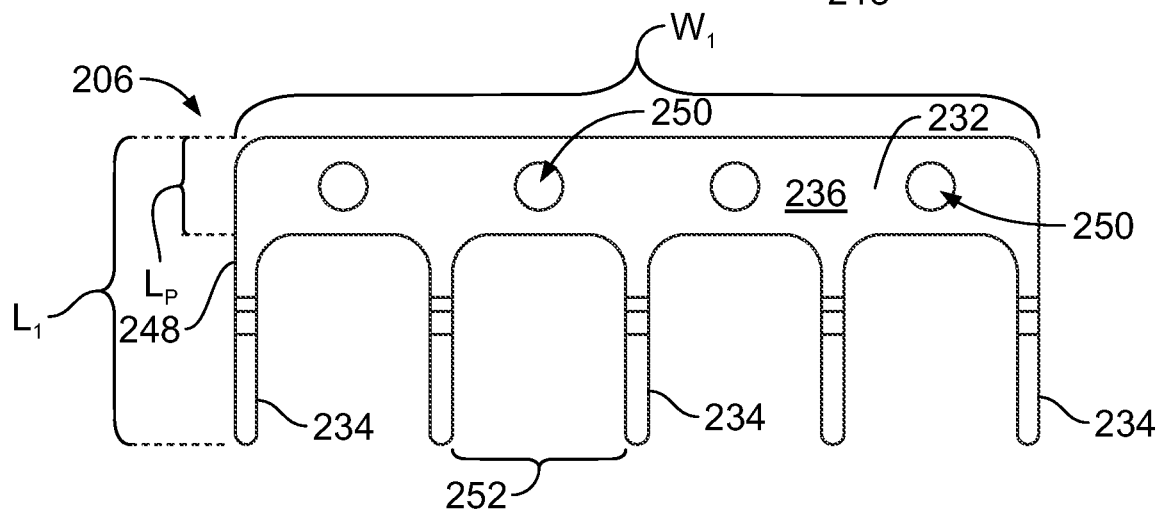
FIG. 5 is a plan view of a ground-terminating component that may be used with the electrical assembly of FIG. 4.
Figure 6:
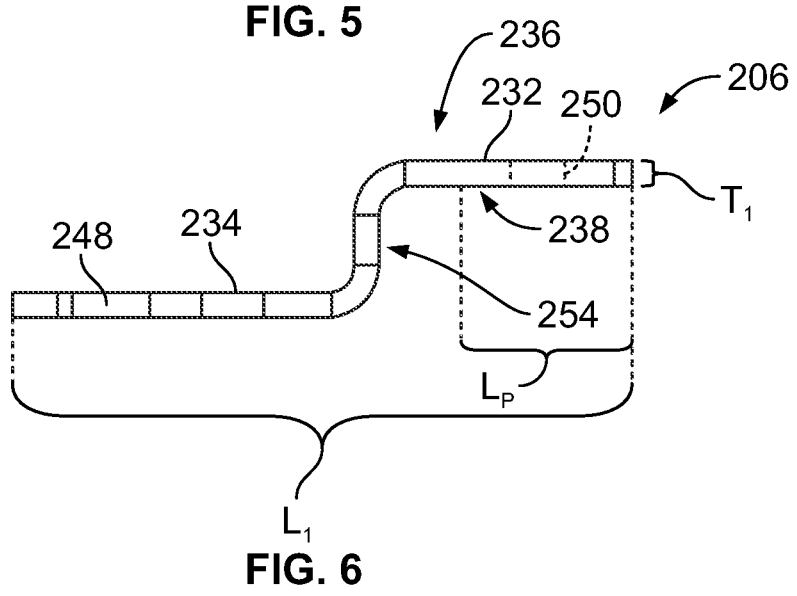
FIG. 6 is a side view of the ground-terminating component that may be used with the electrical assembly of FIG. 4.

FIGS. 5 and 6 are isolated plan and side views of a ground-terminating component 206 in accordance with one embodiment. As shown, the ground-terminating component 206 includes a main panel or busbar portion 232 and a plurality of fingers 234 that extend therefrom. In some embodiments, the ground-terminating component 206 is stamped from sheet metal and formed to include the features set forth herein. The ground-terminating component 206 has a length $L_1$ (FIG. 5), a width $W_1$, and thickness $T_1$ (FIG. 6). The main panel 232 has a length $L_P$. The ground-terminating component 206 includes a top surface 236 and a bottom surface 238 (FIG. 6) that face in opposite directions. The thickness $T_1$ is measured between the top and bottom surfaces 236, 238. In the illustrated embodiment, the thickness $T_1$ is substantially uniform, but may have varying sizes in other embodiments.

A profile of the ground-terminating component 206 is defined by a wall edge 248, which is a stamped edge in the illustrated embodiment. As shown, the wall edge 248 defines the main panel 232 and the fingers 234. The main panel 232 has a substantially rectangular shape with the fingers 234 extending therefrom. The fingers 234 are distributed along the length $L_1$ of the ground-terminating component 206. Adjacent fingers 234 may be separated from each other by a pair spacing 252 (FIG. 5). The pair spacing 252 may be sized so that a differential pair of signal conductors may be positioned between the adjacent fingers 234.

In certain embodiments, the main panel 232 includes a plurality of wall openings 250 that extend entirely through the thickness $T_1$. In other embodiments, the wall openings 250 may extend only partially through the thickness $T_1$ or, alternatively, the main panel 232 may not include the wall openings 250. The wall openings 250 may be dimensioned to permit a solder paste to be deposited therethrough. In other embodiments, a conductive epoxy or foam may be deposited through the wall openings 250.

As shown in FIG. 6, the fingers 234 may include joint portions 254. The joint portions 254 are configured to change a level of the bottom surface 238. More specifically, the bottom surface 238 is configured to interface with the communication cables 204 (FIG. 4) at a first level and configured to interface with the circuit board 202 (FIG. 4) at a different second level.

Figure 7:
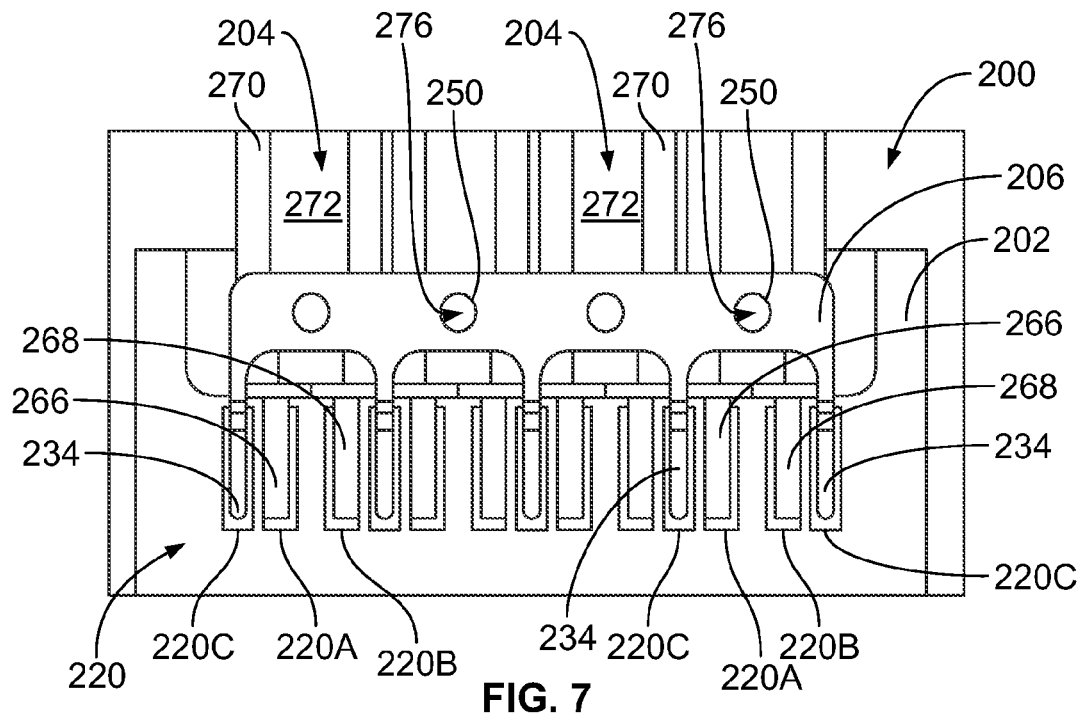
FIG. 7 is an enlarged plan view of the electrical assembly of FIG. 4 illustrating the ground-terminating component in greater detail.

FIG. 7 is a plan view of a portion of the electrical assembly 200 illustrating the ground-terminating component 206 interconnecting the communication cables 204 and the circuit board 202. The communication cables 204 include cable jackets 270 having exterior surfaces 272 configured to interface with the ground-terminating component 206. Also shown, the wall openings 250 of the ground-terminating component 206 are aligned with corresponding access openings 276 of the cable jackets 270.

The electrical contacts 220 include signal contacts 220A, 220B and ground contacts 220C. The signal contacts 220A, 220B are configured to be mechanically and electrically coupled to wire-terminating ends 266, 268, respectively, of the communication cables 204. The ground contacts 220C are configured to be mechanically and electrically coupled to corresponding fingers 234 of the ground-terminating component 206.

Figure 8:
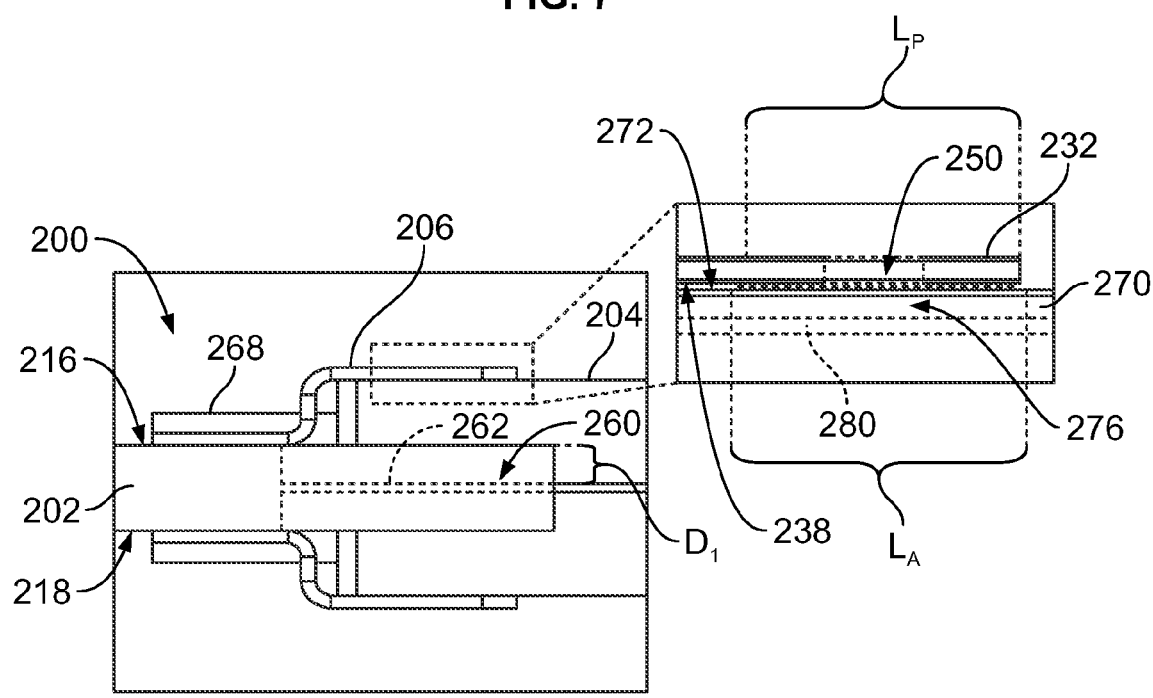
FIG. 8 is an enlarged side view of the electrical assembly of FIG. 4 illustrating the ground-terminating component in greater detail.

FIG. 8 is a side view of the electrical assembly 200. Although the following describes mechanically and electrically coupling the communication cables 204 to the board surface 216, the description may be similarly applied to the communication cables 204 and the board surface 218. As shown, the circuit board 202 includes a cable recess 260 that extends a depth $D_1$ into the circuit board 202 from the board surface 216. The cable recess 260 may extend from the board surface 216 to a ground plane 262 of the circuit board 202. The cable recess serves as a nest for one of the communication cables 204, and thus the size and shape of the cable recess 260 generally corresponds to a size and shape of the communication cable 204. For example, the depth $D_1$ of the cable recess 260 may be configured so that the wire-terminating ends 266 (FIG. 7) and the wire-terminating ends 268 are substantially flush with the board surface 216 or, more specifically, the electrical contacts 220 (FIG. 7).

FIG. 8 also includes an enlarged view of the main panel 232 of the ground-terminating component 206 mounted to the communication cable 204. The ground-terminating component 206 is configured to be electrically coupled to shield layers 280 of the communication cables 204. As shown, the access openings 276 may extend from the exterior surface 272 of the cable jacket 270 to the shield layer 280. The access openings 276 may expose the corresponding shield layers 280 to an exterior of the communication cable 204. In some embodiments, a length $L_A$ of the access opening 276 is substantially equal to or greater than the length $L_P$. The main panel 232 may be positioned adjacent to the communication cables 204 such that the bottom surface 238 along the main panel 232 interfaces with the exterior surfaces 272 of the cable jackets 270 and/or covers the access opening 276. In some cases, the main panel 232 may extend a depth into the access opening 276 toward the shield layer 280.

For embodiments that include the access openings 276, the wall openings 250 of the main panel 232 may be located to align with corresponding access openings 276 when the main panel 232 interfaces with the communication cable 204. A solder paste (not shown) may be deposited into and/or near the access openings 276 and the wall openings 250. Heat may be applied to the electrical assembly 200 to melt and/or cure the solder paste. After the heating stage, the solder mechanically and electrically couples the main panel 232 to the shield layers 280 of the different communication cables 204.

In other embodiments, a different conductive binding material may be used. For example, the conductive binding material may be an adhesive, epoxy, foam, tape, or the like. The conductive binding material may or may not affix the main panel 232 to the shield layers 280. In some embodiments, a conductive tape or other binding material may be deposited directly along the bottom surface 238. The bottom surface 238 may then be pressed against the shield layer(s) 280. The action of compressing the binding material may activate the binding material to harden or cure. For such embodiments, a wall opening may or may not be used.

Figure 9:
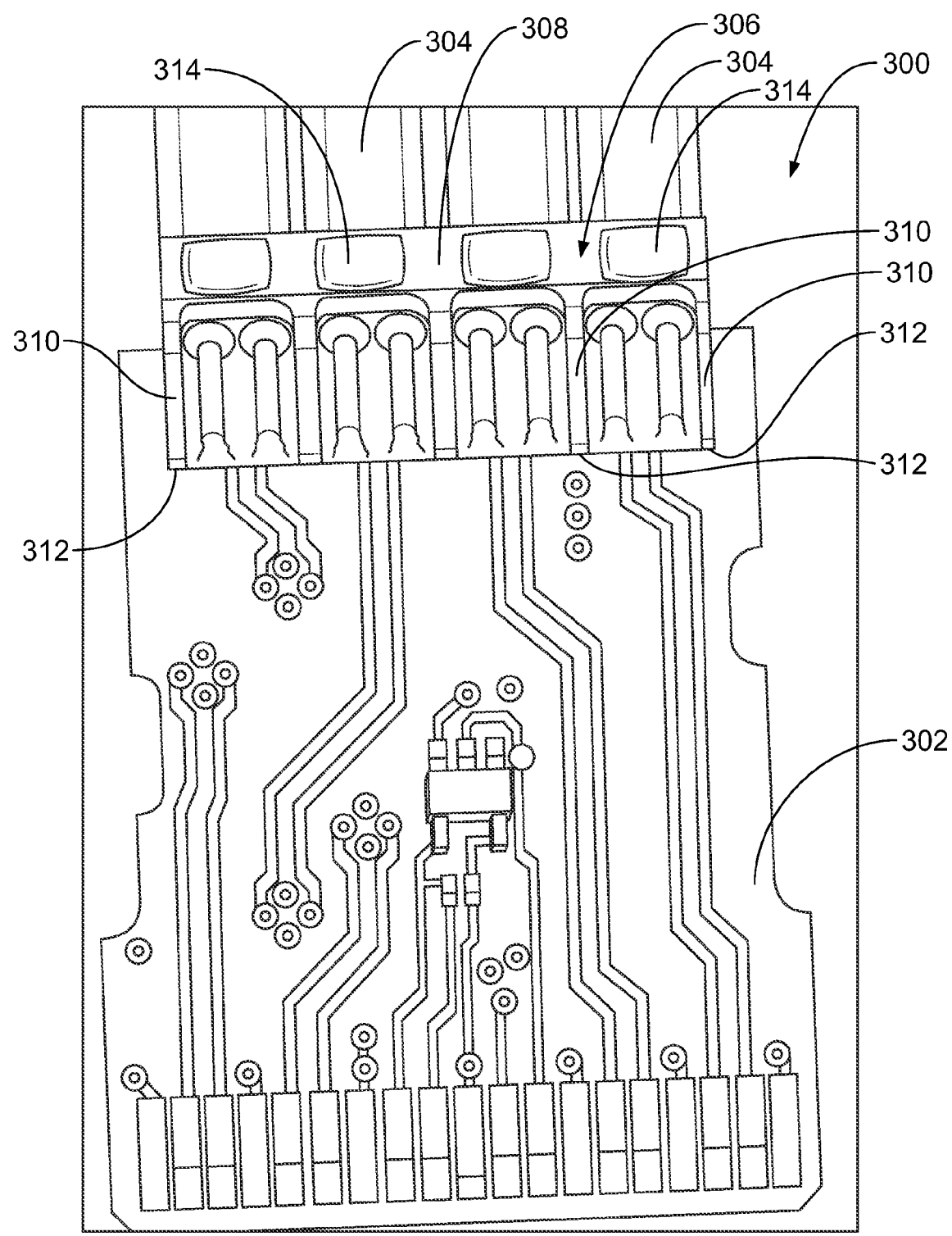
FIG. 9 illustrates an electrical assembly according to one embodiment that may use a ground-terminating component that is similar to the ground-terminating component of FIG. 5.

FIG. 9 illustrates an electrical assembly 300 including a circuit board 302, communication cables 304, and a ground-terminating component 306 that grounds the communication cables 304 to the circuit board 302. The ground-terminating component 306 is similar to the ground-terminating component 206 (FIG. 4) and includes a main panel 308 and fingers 310 that project from the main panel 308. The fingers 310 are mechanically and electrically coupled to ground contacts 312 of the circuit board 302. For example, the fingers 310 may be soldered to the ground contacts 312. Although not shown, the main panel 308 includes wall openings that align with access openings of the communication cables 304 as described above with respect to the electrical assembly 200 (FIG. 4). A solder material 314 has been deposited within the wall and access openings and reflowed to mechanically and electrically couple the main panel 308 to shield layers (not shown) of the communication cables 304. As such, a conductive path exists between the ground contacts 312 and the shield layers of the communication cables 304 through the ground-terminating component 306.

Figure 10:
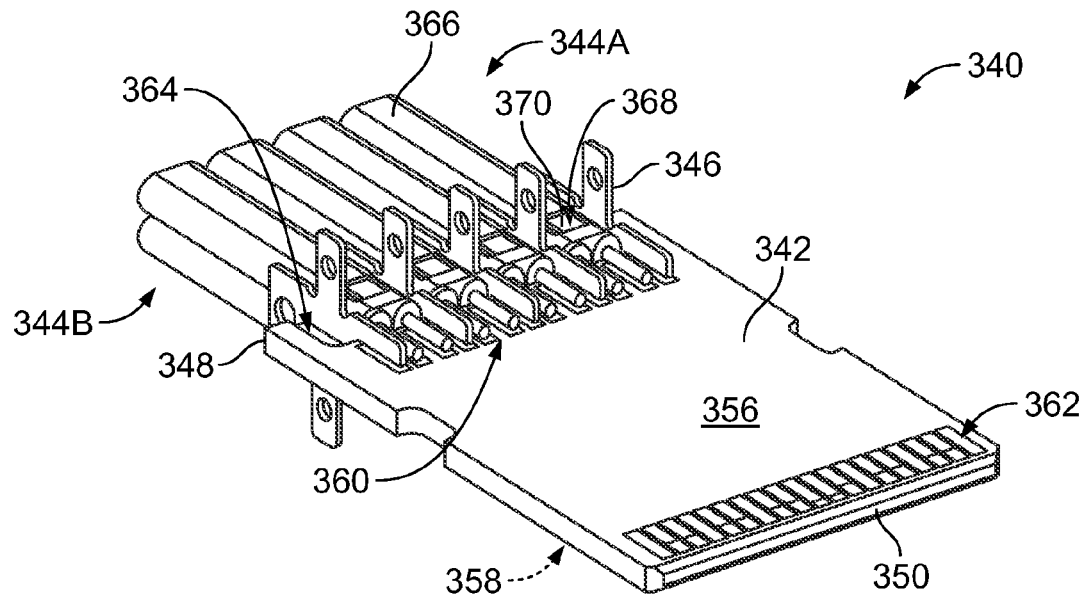
FIG. 10 is an isolated perspective view of an electrical assembly prior to final assembly according to one embodiment that may be used with the electrical device of FIG. 1.

FIG. 10 is an isolated perspective view of an electrical assembly 340 in a stage prior to final assembly. The electrical assembly 340 includes a circuit board 342, communication cables 344, and ground-terminating components 346 interleaved between the communication cables 344. The circuit board 342 may be similar or identical to the circuit board 142 (FIG. 3) or other circuit boards described herein, and the communication cables 344 may be similar or identical to the communication cables 160 (FIG. 3) or other communication cables described herein. For example, the circuit board 342 has a terminating edge 348 and a mating edge 350. The circuit board 342 also has first and second board surfaces 356, 358. As shown, the board surface 356 has electrical contacts 360 disposed proximate to the terminating edge 348 and electrical contacts 362 disposed proximate to the mating edge 350. Although not shown, the board surface 358 may also include electrical contacts proximate to the terminating and mating edges 348, 350.

In the illustrated embodiment, each of the ground-terminating components 346 is configured to couple two of the communication cables 344 to respective opposite sides of the circuit board 342. More specifically, each of the ground-terminating components 346 is configured to couple a first communication cable 344A to the board surface 356 and a second communication cable 344B to the board surface 358.

Also shown, the circuit board 342 may include a cable recess 364 along the terminating edge 348. The cable recess 364 may be sized and shaped in a similar manner as the cable recess 260 (FIG. 8). Each of the communication cables 344 may include a cable jacket 366 having an access opening 368 formed therethrough that exposes a corresponding shield layer 370 of the communication cable 344. The ground-terminating components 346 are coupled to the circuit board 342 and positioned between adjacent communication cables 344. Each of the ground-terminating components 346 is configured to be mechanically and electrically coupled to the shield layers 370 of two communication cables 344.

Figure 11:
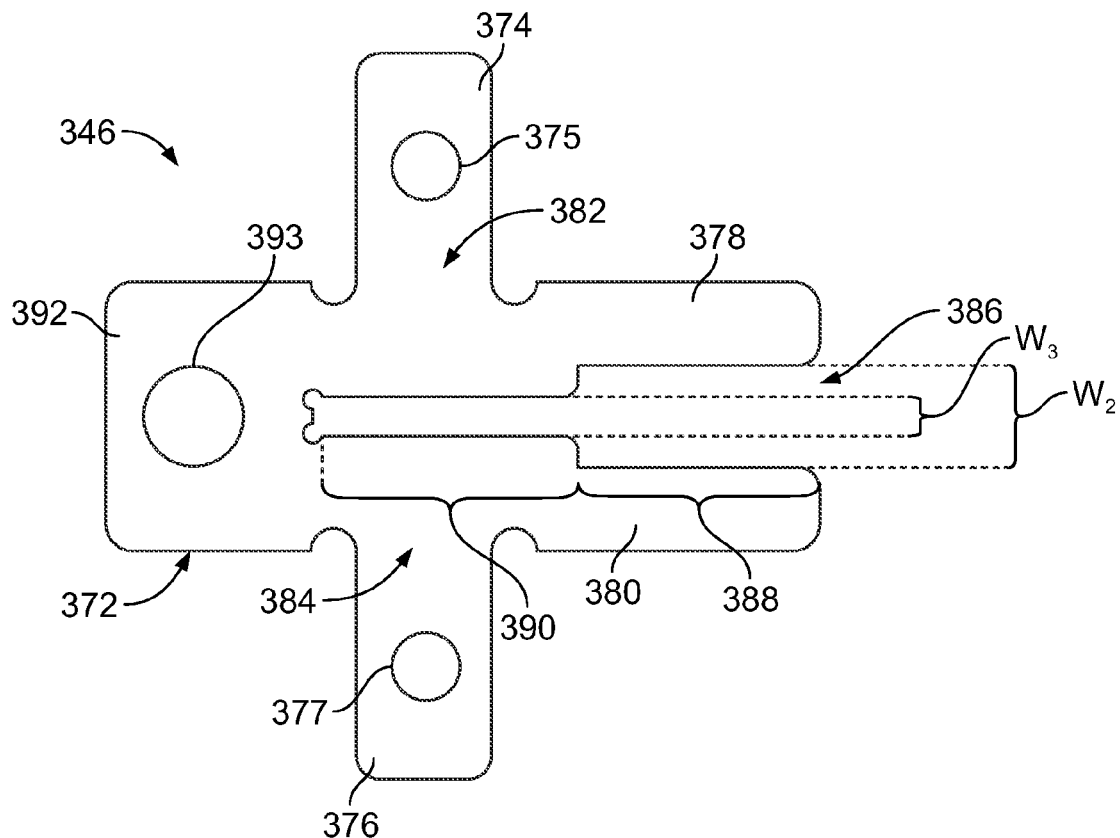
FIG. 11 is a plan view of a ground-terminating component that may be used with the electrical assembly of FIG. 10.

FIG. 11 is a side view of one of the ground-terminating components 346 before the ground-terminating component 346 is in its operative position coupled to the circuit board 342 (FIG. 10) and the corresponding communication cables 344 (FIG. 10). In some embodiments, the ground-terminating component 346 is a single continuous piece of material. For example, the ground-terminating component 346 may be stamped and formed from sheet metal to exhibit the features described herein. In other embodiments, the ground-terminating component 346 may be molded. As shown, the ground-terminating component 346 has an outer edge 372 that defines a two-dimensional profile of the ground-terminating component 346 prior to the ground-terminating component 346 being shaped.

The ground-terminating component 346 includes first and second main panels 374, 376 that project in opposite directions and first and second fingers 378, 380 that project in a common direction substantially parallel to each other. The first and second main panels 374, 376 may have tab-like shapes (e.g., rectangular shapes). Optionally, the first and second main panels 374, 376 include wall openings 375, 377 that extend entirely through a thickness of the ground-terminating component 346. The ground-terminating component 346 may also include a third main panel 392 having a wall opening 393. The main panel 392 may provide additional structural integrity to the ground-terminating component 346 and may also facilitate positioning the ground-terminating component 346 with respect to the circuit board 342.

As shown in FIG. 11, the first main panel 374 projects from a joint portion 382 that is directly coupled to the finger 378, and the second main panel 376 projects from a joint portion 384 that is directly coupled to the finger 380. The first and second main panels 374, 376 are configured to be bent at the joint portions 382, 384, respectively, so that the first and second main panels 374, 376 may interface with the cable jackets 366 (FIG. 10) and extend across the corresponding access openings 368 (FIG. 10).

The ground-terminating component 346 has a board-receiving slot 386 that extends between the fingers 378, 380. The board-receiving slot 386 includes a board portion 388 and a recess portion 390. The board portion 388 has a width $W_2$ that is sized to receive a maximum thickness $T_2$ (shown in FIG. 12) of the circuit board 342. The recess portion 390, on the other hand, has a width $W_3$ that is dimensioned to receive a thickness $T_3$ of the circuit board 342 that is defined between ground planes 396, 398 (shown in FIG. 12).

Figure 12:
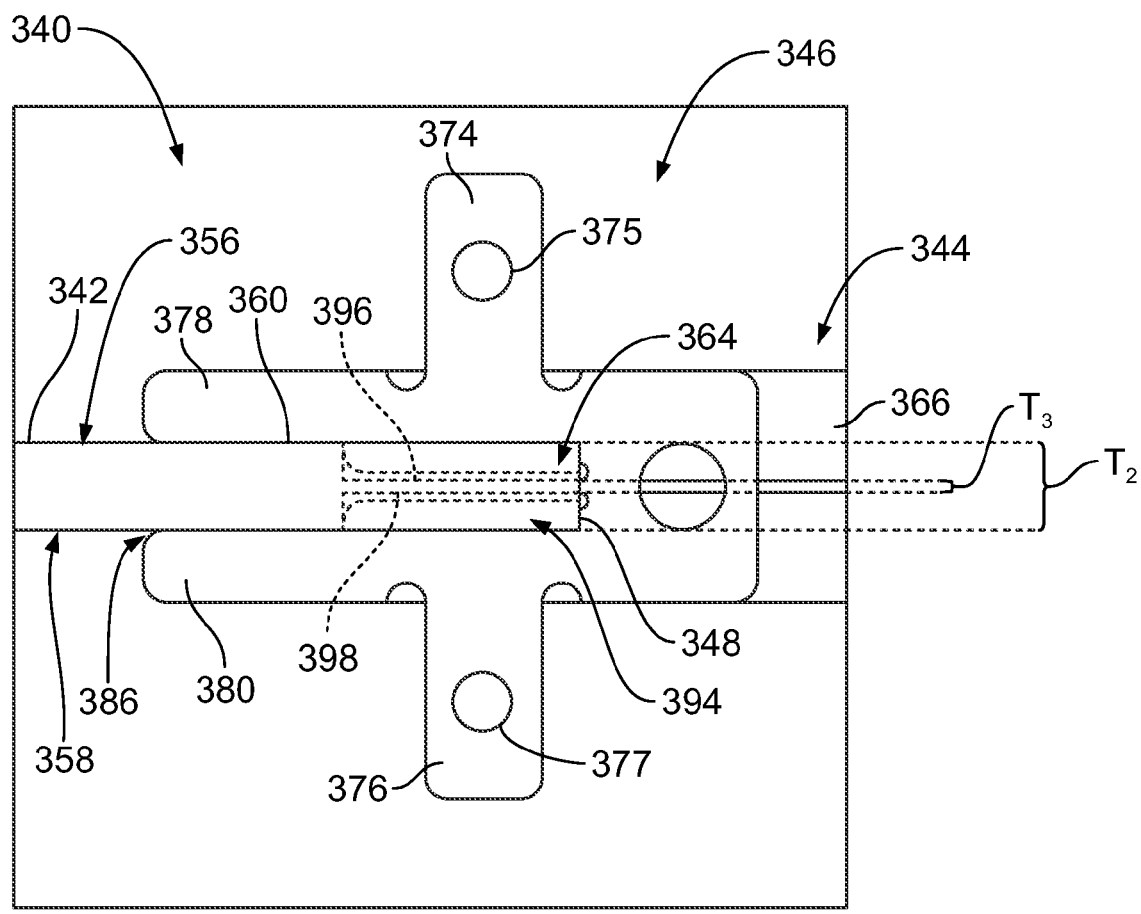
FIG. 12 is an enlarged side view of the electrical assembly of FIG. 10 illustrating the ground-terminating component in greater detail.

FIG. 12 is a side view of the electrical assembly 340 illustrating the ground-terminating component 346 coupled to the circuit board 342. The circuit board 342 includes the cable recess 364 that extends into the circuit board 342 from the board surface 356. The circuit board 342 also includes a cable recess 394 that extends into the circuit board 342 from the board surface 358. The cable recesses 364, 394 extend to respective ground planes 396, 398 of the circuit board 342. The ground planes 396, 398 may be a metal layer within the circuit board 342. The cable recesses 364, 394 are sized and shaped to receive portions of the communication cables 344. As shown, the circuit board 342 has the thickness $T_2$ between the board surfaces 356, 358 and the thickness $T_3$ between the ground planes 396, 398.

To mount the ground-terminating component 346 to the circuit board 342, the terminating edge 348 of the circuit board 342 is received within the board-receiving slot 386. The fingers 378, 380 may slide along the board surfaces 356, 358, respectively, when the ground-terminating component 346 is mounted. When operatively positioned, the portion of the circuit board 342 that includes the electrical contacts 360 is disposed between the fingers 378, 380 within the board portion 388 (FIG. 11) of the board-receiving slot 386. The portion of the circuit board 342 that includes the exposed areas of the ground planes 396, 398 is disposed between the fingers 378, 380 within the recess portion 390 (FIG. 11) of the board-receiving slot 386.

After the ground-terminating components 346 are mounted to the circuit board 342, the fingers 378, 380 may be mechanically and electrically coupled (e.g., soldered) to the corresponding electrical contacts 360. The first and second main panels 374, 376 may be bent so that the first and second main panels 374, 376 extend across respective access openings 368 (FIG. 10) and interface with the cable jackets 366. The wall openings 375, 377 may align with the corresponding access openings 368. The first and second main panels 374, 376 may then be mechanically and electrically coupled to the shield layer 370 (FIG. 10) in a similar manner as described above with respect to the electrical assembly 200 (FIG. 4).

In the illustrated embodiment, the ground-terminating component 346 may loosely engage the circuit board 342 and may only be secured to the circuit board 342 after the ground-terminating component 346 is soldered to the circuit board 342 and the shield layers 370 (FIG. 10). In other embodiments, however, the ground-terminating component 346 may frictionally engage the circuit board 342 such that the ground-terminating component 346 is securely held in a fixed position.

Figure 13:
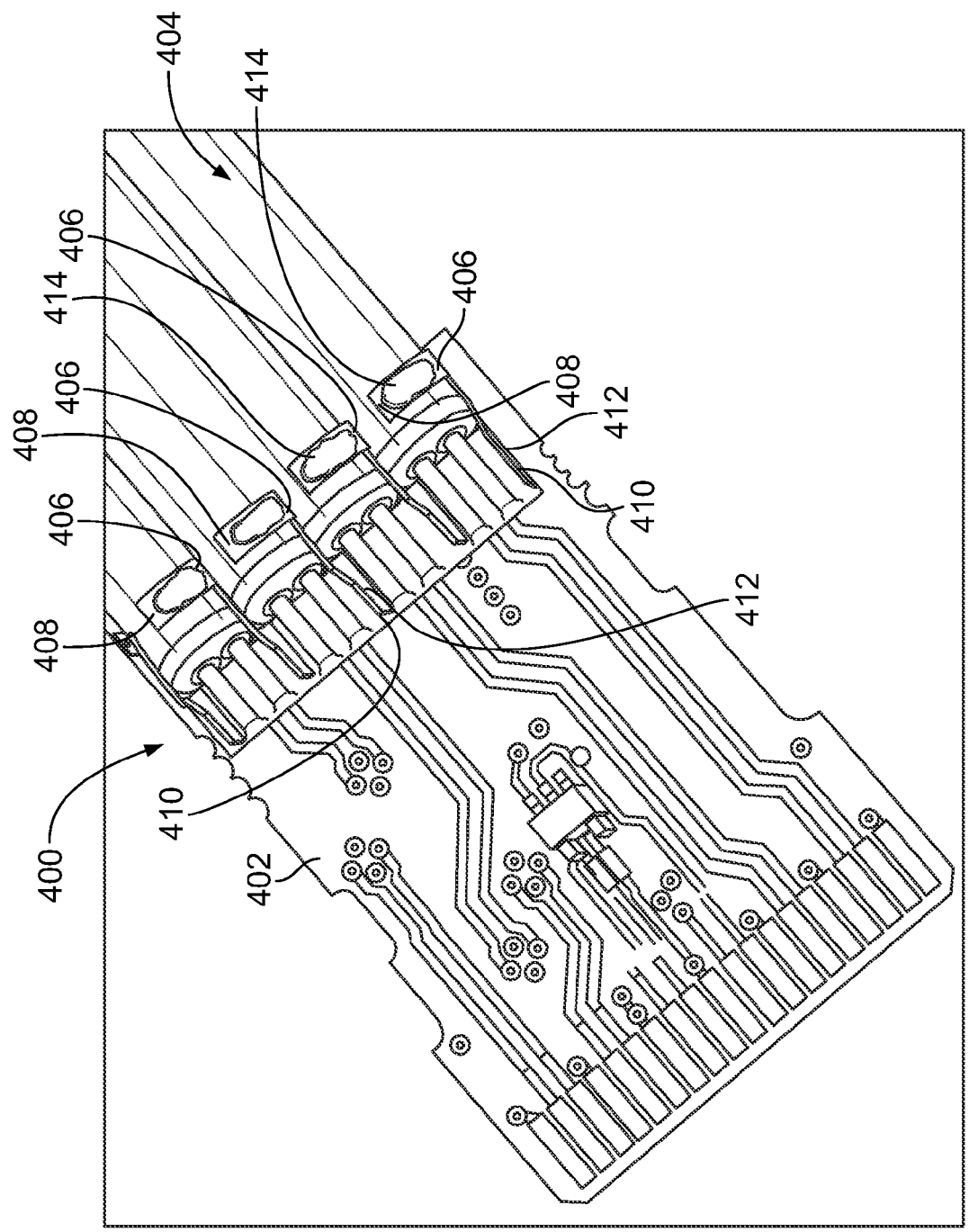
FIG. 13 illustrates an electrical assembly according to one embodiment that may use a ground-terminating component that is similar to the ground-terminating component of FIG. 11.

FIG. 13 illustrates an electrical assembly 400 including a circuit board 402, communication cables 404, and ground-terminating components 406 that ground respective communication cables 404 to the circuit board 402. The ground-terminating components 406 are similar to the ground-terminating components 346 (FIG. 10) and include a main panel 408 and fingers 410 that project from the main panel 408. The fingers 410 are mechanically and electrically coupled to ground contacts 412 of the circuit board 402. Although not shown, the main panel 408 includes wall openings that align with access openings of the communication cables 404 as described above. A conductive binding material 414 (e.g., solder) has been deposited within the wall and access openings and reflowed to mechanically and electrically couple the main panel 408 to shield layers (not shown) of the communication cables 404. As such, conductive paths exist between the ground contacts 412 and the shield layers of the communication cables 404 through the ground-terminating component 406.

Figure 14:
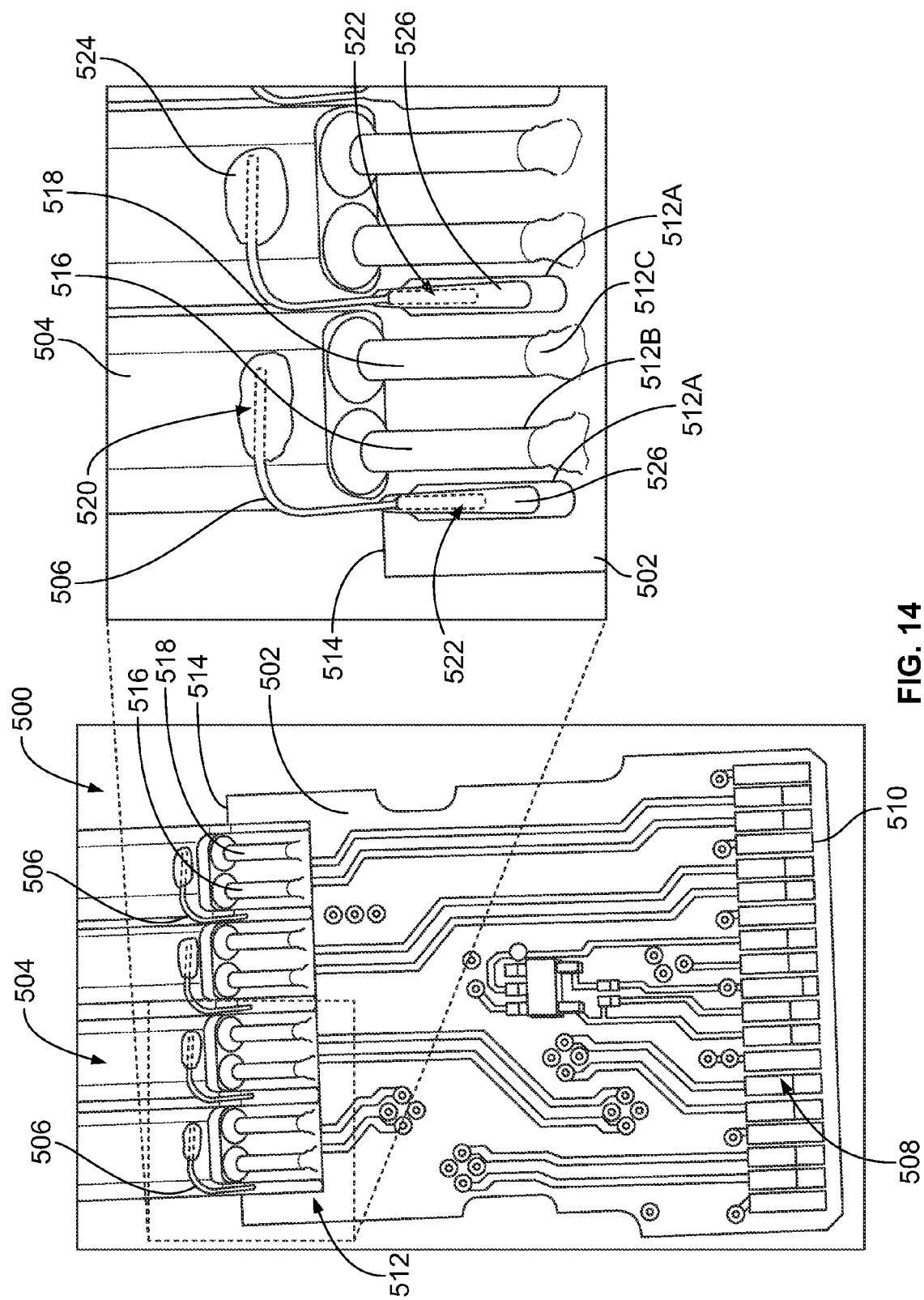
FIG. 14 illustrates an electrical assembly formed in accordance with one embodiment.

FIG. 14 illustrates an electrical assembly 500 including a circuit board 502, communication cables 504, and ground-terminating components 506 that ground respective communication cables 504 to the circuit board 502. The circuit board 502 and the communication cables 504 may be similar or identical to the other circuit boards and communication cables described herein. For example, the circuit board 502 may include electrical contacts 508 proximate to a mating edge 510 and electrical contacts 512 proximate to a terminating edge 514 of the circuit board 502. The communication cables 504 include wire-terminating ends 516, 518 that are mechanically and electrically coupled to corresponding electrical contacts 512. Although not shown, the communication cables 504 may also include access openings that provide access to shield layers of the communication cables 504.

As shown in in the enlarged window of FIG. 14, the ground-terminating components 506 extend between the communication cables 504 and the circuit board 502 to electrically couple the shield layer (not shown) and corresponding ground contacts 512A. The wire-terminating ends 516, 518 are soldered to signal contacts 512B, 512C. The signal contacts 512B, 512C are positioned between two ground contacts 512A

The ground-terminating components 506 may be elongated conductive strips or wires. For example, each of the ground-terminating components 506 includes first and second end portions 520, 522. The first end portion 520 is mechanically and electrically coupled to the shield layer at an access opening (not shown) of the communication cable 504. A solder material 524 deposited within the access opening may be reflowed with the first end portion 520 in contact with the solder material 524. When cured or hardened, the first end portion 520 may be mechanically coupled to the communication cable 504 and electrically coupled to the shield layer through the access opening. The second end portion 522 is mechanically and electrically coupled to the corresponding ground contact 512A using, for example, a solder material 526, which may be the same as the solder material 524. Accordingly, the shield layers of the communication cables 504 may be electrically coupled to the ground contacts 512A of the circuit board 502.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. An electrical device comprising:
   a circuit board having signal contacts and at least one ground contact along a surface of the circuit board;
   a communication cable including a differential pair of signal conductors, a shield layer that surrounds the signal conductors, and a cable jacket that surrounds the shield layer, wherein each of the signal conductors has a wire-terminating end that is engaged to a corresponding signal contact of the circuit board, the wire-terminating ends projecting beyond a jacket edge of the cable jacket, the cable jacket having an access opening therethrough that exposes a portion of the shield layer, the access opening being defined by an inner edge of the cable jacket, wherein a longitudinal portion of the cable jacket extends between the inner edge and the jacket edge; and
   a ground-terminating component electrically coupled to the shield layer through the access opening and electrically coupled to the at least one ground contact.

2. The electrical device of claim 1, wherein the circuit board includes a terminating edge and a mating edge, the signal contacts and the at least one ground contact being contact pads that are disposed proximate to the terminating edge, the circuit board also including a plurality of contact pads disposed proximate to the mating edge.

3. The electrical device of claim 1, further comprising a conductive binding material located within the access opening that electrically couples the ground-terminating component to the shield layer through the access opening.

4. The electrical device of claim 1, wherein the communication cable does not include a drain wire.

5. The electrical device of claim 1, wherein the ground-terminating component has a main panel and a finger that projects from the main panel, the finger engaging the at least one ground contact, the main panel interfacing with the cable jacket and being electrically coupled to the shield layer through the access opening.

6. The electrical device of claim 1, wherein the ground-terminating component includes at least one of an elongated conductive strip or a main panel that interfaces with the cable jacket.

7. The electrical device of claim 1, wherein the ground-terminating component has a bottom surface that interfaces with the cable jacket.

8. The electrical device of claim 7, wherein the ground-terminating component includes a main panel having the bottom surface, the bottom surface of the main panel covering a portion of the access opening of the cable jacket and interfacing with the longitudinal portion of the cable jacket.

9. The electrical device of claim 1, further comprising a plurality of the communication cables and a plurality of the ground-terminating components, the ground-terminating components being interleaved between the communication cables, each of the ground-terminating components including a main panel, wherein each of the main panels interfaces with the cable jacket of a respective communication cable and is electrically coupled to the shield layer of the respective communication cable through the access opening of the cable jacket.

10. An electrical device comprising:
    a circuit board having signal contacts and at least one ground contact along a surface of the circuit board;
    a communication cable including a differential pair of signal conductors, a shield layer that surrounds the signal conductors, and a cable jacket that surrounds the shield layer, wherein each of the signal conductors has a wire-terminating end that is engaged to a corresponding signal contact of the circuit board, the cable jacket having an access opening therethrough that exposes a portion of the shield layer; and a ground-terminating component having a main panel and a finger that projects from the main panel, the finger engaging the at least one ground contact, the main panel having a wall opening that aligns with the access opening of the cable jacket, the main panel interfacing with the cable jacket and being electrically coupled to the shield layer through the access opening.

11. The electrical device of claim 10, wherein the wire-terminating ends project beyond an edge of the cable jacket, the access opening being located a longitudinal distance from the edge of the cable jacket.

12. The electrical device of claim 10, further comprising a conductive binding material located within the access opening and the wall opening that electrically couples the ground-terminating component to the shield layer.

13. The electrical device of claim 10, wherein the communication cable does not include a drain wire.

14. The electrical device of claim 10, further comprising a plurality of the communication cables, the main panel interfacing with the cable jacket of each of the communication cables and being electrically coupled to the shield layers of the communication cables through the access openings of the cable jackets.

15. The electrical device of claim 14, wherein the main panel has a plurality of the wall openings, each of the wall openings aligning with a respective access opening of a respective cable jacket.

16. The electrical device of claim 10, further comprising a plurality of the communication cables and a plurality of the ground-terminating components, the wall opening of each of the main panels aligning with a respective access opening of a respective cable jacket.

17. The electrical device of claim 16, further comprising conductive binding material located within the access openings and the wall openings, the conductive binding material electrically coupling the ground-terminating components to the respective shield layers.

18. An electrical device comprising:

a circuit board having signal contacts and ground contacts along a surface of the circuit board;

a plurality of communication cables that each include a differential pair of signal conductors, a shield layer that surrounds the signal conductors of the respective communication cable, and a cable jacket that surrounds the shield layer of the respective communication cable, wherein each of the signal conductors has a wire-terminating end that is engaged to a corresponding signal contact of the circuit board, each of the cable jackets having an access opening therethrough that exposes a portion of the corresponding shield layer; and a ground-terminating ferrule having a main panel and fingers that project from the main panel, the fingers engaging corresponding ground contacts, the main panel interfacing with the cable jackets and being electrically coupled to the shield layers through the corresponding access openings.

19. The electrical device of claim 18, wherein the main panel has wall openings that align with corresponding access openings, the electrical device further comprising conductive binding material located within the access openings and the wall openings, the conductive binding material electrically coupling the ground-terminating component to the shield layers of the communication cable.

20. The electrical device of claim 18, wherein the communication cables do not include drain wires.

* * * * *